US011831432B2

(12) United States Patent
Beeler et al.

(10) Patent No.: US 11,831,432 B2
(45) Date of Patent: Nov. 28, 2023

(54) OPTIMIZATION OF ALL SOFTWARE MODEM USING FLEXIBLE CONFIGURATION PARAMETERS FOR HIGH-PERFORMANCE COMPUTING (HPC)

(71) Applicant: Envistacom, LLC, Atlanta, GA (US)

(72) Inventors: Michael Beeler, Jefferson, MD (US); Michael Geist, Huntersville, NC (US); Cris Mamaril, Mesa, AZ (US); Jason Duchez, Urbana, MD (US); Jakob Harmon, Charlottesville, VA (US); Richard Davis, Bel Air, MD (US)

(73) Assignee: APOTHYM TECHNOLOGIES GROUP, LLC, Peachtree Corners, GA (US)

( * ) Notice: Subject to any disclaimer, the term of this patent is extended or adjusted under 35 U.S.C. 154(b) by 488 days.

(21) Appl. No.: 17/088,401

(22) Filed: Nov. 3, 2020

(65) Prior Publication Data

US 2021/0135782 A1     May 6, 2021

Related U.S. Application Data

(60) Provisional application No. 62/930,284, filed on Nov. 4, 2019.

(51) Int. Cl.
  *H04L 1/00*     (2006.01)
  *H04L 25/03*    (2006.01)
  *H03M 13/11*    (2006.01)

(52) U.S. Cl.
  CPC .......... *H04L 1/0045* (2013.01); *H03M 13/11* (2013.01); *H04L 25/03057* (2013.01)

(58) Field of Classification Search
  CPC . H04L 1/0045; H04L 25/03057; H03M 13/11
  See application file for complete search history.

(56) References Cited

U.S. PATENT DOCUMENTS

2017/0353246 A1* 12/2017 Frankel .................. H04B 10/40

* cited by examiner

*Primary Examiner* — Curtis B Odom
(74) *Attorney, Agent, or Firm* — MCBEE MOORE & VANIK IP, LLC; Susan McBee; Christopher Nichols

(57) ABSTRACT

A method to provide flexibility on the configuration and operation of the modulator, demodulator, and modem, where purpose-built (legacy) devices are not traditionally capable of exposing a level of control and flexibly for a user or an autonomous program for optimizing performance. Providing user or programmatic control of algorithms is traditionally not possible for purpose-built modems. Parameters such as the number of decoder iterations that are performed on Forward Error Correction (FEC), Interference Mitigation algorithm, or dynamic adjustment loop bandwidth to combat phase noise can be adjusted autonomously to optimize receiver performance. The all software modem, supported by a High-Performance Computing (HPC) architecture, removes the limitation due to the flexibility of programming resources and available performance. Unlike most purpose-built hardware, the HPC allows processing resources to dynamically be reallocated, so that as additional performance is desired, the resources may be increased and decreased as required.

17 Claims, 13 Drawing Sheets
(3 of 13 Drawing Sheet(s) Filed in Color)

CONTROL: DEMOD

| | | |
|---|---|---|
| Mode: | CCM | MOD Type: QPSK |
| Frame Size: | Normal | Code Rate: ¼ |
| Spectrum: | Normal | Pilots: On |
| Alpha Rolloff: | 20% | LDPC Iterations (Max): 100 |
| | | Equalizer Type: Normal |
| Symbol Rate: | 1000 Ksps | Data Rate: 800 Kbps |
| Encapsulation Type: | GSE | Data Rate: 800 Kbps |
| Gold Code: | | Es/No Alarm Threshold: 1 dB |

SUBMIT

FIG. 13

OPTIMIZATION OF ALL SOFTWARE MODEM USING FLEXIBLE CONFIGURATION PARAMETERS FOR HIGH-PERFORMANCE COMPUTING (HPC)

CROSS REFERENCE TO RELATED PATENT APPLICATIONS

This patent application claims priority to U.S. Provisional Application No. 62/930,284, filed on Nov. 4, 2019, the contents of which are hereby incorporated by reference in its entirety.

TECHNICAL FIELD

This disclosure relates to network communication, and more particularly to optimization of modem parameters for an all software modem operating in high-performance computing.

BACKGROUND

Providing user or programmatic control of algorithms has traditionally not been implemented in purpose-built modems. For example, the number of iterations performed on Forward Error Correction (FEC) or Forward Error Detection (FED) is traditionally fixed or limited by the processing resources.

BRIEF SUMMARY

In an embodiment, a method for optimization of all software modem using flexible configuration parameters for high-performance computing (HPC) platform, the method comprising: receiving a digital IQ data at the all software modem, wherein the all software modem comprises a demodulator, and wherein the demodulator is configured to adjust demodulator parameters; storing and queuing the digital IQ data for downstream processes for each demodulator stage; adjusting the demodulator parameters of a demodulator stage in response to decoding of data fails; and re-attempting the demodulator stage with the adjusted demodulator parameters.

In an embodiment, the all software modem may be an application running on a HPC platform implemented via a high-level coding language.

In an embodiment, the HPC platform may comprise at least one or more processor cores and wherein the cores comprise at least one of a general purpose central processing unit, a graphic processing unit, or a field programmable gate arrays.

In an embodiment, the demodulator may comprise a digital IF transport receiver, an Interference Mitigation (IM), a Root-Raised Cosine Filter (RRCF), an equalizer, a timing recovery, a carrier recovery, a signal demodulator, a PL Deframer, a FEC Decoder, a BB Deframer.

In an embodiment, the demodulator may be configured to adjust parameters of the IM, the equalizer, the timing recovery, the carrier recovery, the demodulator, and the decoder.

In an embodiment, the digital IQ data at a demodulator stage may be stored and retrieved with full fidelity.

In an embodiment, the method may further comprise altering FEC parameters and increasing a number of Low-Density Parity Check (LDPC) iterations.

In an embodiment, the data may be reprocessed with the adjusted parameters at a current demodulator stage or a previous demodulator stage in response to the decoding of the data fails.

In an embodiment, a signal nay be sent back to the RRCF and the equalizer to attempt to reprocess a block of data that failed a decoding of a FEC block using a recursive least squares or a zero forcing algorithm in response to the block of data is not processed.

In an embodiment, a number of decoding attempts may increase at the FEC block in response to the FEC decoding fails.

In one embodiment, a method for sending data via all software modem using flexible configuration parameters for high-performance computing (HPC) platform, the method comprising: sending a first user network data from a source; receiving the first user network data at a first modem, wherein the first user network data is modulated to a digital IQ data; sending the digital IQ data to a destination via a network; receiving the digital IQ data at a second modem, wherein the second modem is configured to adjust parameters of demodulator stages; demodulating the digital IQ data to a second user network data; and receiving the second user network data at the destination.

In an embodiment, the all software modem may be an application running on a high-performance computing platform implemented via a high-level coding language.

In an embodiment, the HPC platform may comprise at least one or more processor cores and wherein the cores comprise at least one of a general purpose central processing unit, a graphic processing unit, or a field programmable gate arrays.

In an embodiment, the all software modem may comprise a digital IF transport receiver, an Interference Mitigation (IM), a Root-Raised Cosine Filter (RRCF), an equalizer, a timing recovery, a carrier recovery, a demodulator, a PL Deframer, a FEC Decoder, a BB Deframer.

In an embodiment, the second modem may be configured to adjust parameters of the IM, the equalizer, the timing recovery, the carrier recovery, the demodulator, and the decoder.

In any of the embodiments, the digital IQ data at a demodulator stage may be stored and retrieved with full fidelity.

In an embodiment, the method may further comprise altering a Forward Error Correction (FEC) parameters and increasing a number of Low-Density Parity Check (LDPC) iterations.

In an embodiment, the stored digital IQ data may be held in a queue to allow downstream processes.

In an embodiment, a signal may be sent back to the RRCF and the equalizer to attempt to reprocess a block of data that failed a decoding of a FEC block using a recursive least squares or a zero forcing algorithm in response to the block of data is not processed.

BRIEF DESCRIPTION OF THE DRAWINGS

The patent or application file contains at least one drawing executed in color. Copies of this patent or patent application with color drawing(s) will be provided by the Office upon request and payment of the necessary fee.

For a further understanding of the nature, objects, and advantages of the present disclosure, reference should be had to the following detailed description, read in conjunction with the following drawings, wherein like reference numerals denote like elements.

FIG. 13 depicts an user interface when the number of iterations and equalizer are configurable.

Figure 1:
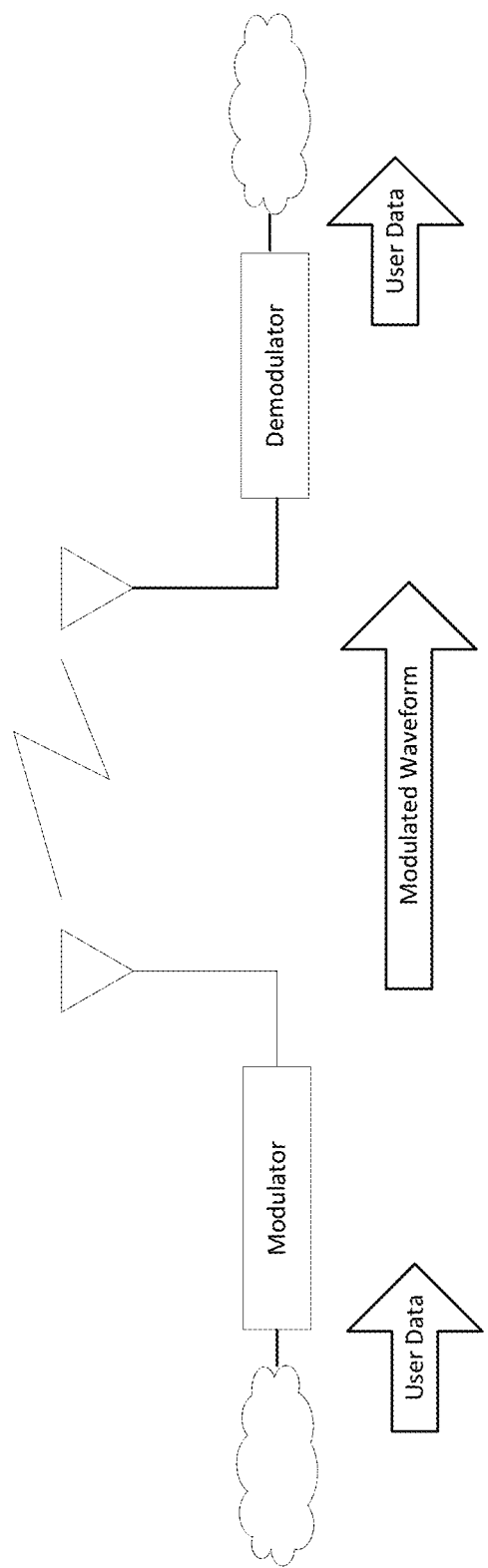
FIG. 1 depicts a network consisting of a modulator and demodulator for a simplex (one-way) communication network.

At the outset, it should be appreciated that like drawing numbers on different drawing views identify identical structural elements of the invention. It also should be appreciated that figure proportions and angles are not always to scale in order to clearly portray the attributes of the present invention.

DETAILED DESCRIPTION

While the present invention is described with respect to what is presently considered to be the preferred embodiments, it is understood that the invention is not limited to the disclosed embodiments. The present invention is intended to cover various modifications and equivalent arrangements included within the spirit and scope of the appended claims.

Furthermore, it is understood that this invention is not limited to the particular methodology, materials and modifications described and as such may, of course, vary. It is also understood that the terminology used herein is for the purpose of describing particular aspects only and is not intended to limit the scope of the present invention, which is limited only by the appended claims.

Unless defined otherwise, all technical and scientific terms used herein have the same meaning as commonly understood to one of ordinary skill in the art to which this invention belongs. It should be appreciated that the term "substantially" is synonymous with terms such as "nearly", "very nearly", "about", "approximately", "around", "bordering on", "close to", "essentially", "in the neighborhood of", "in the vicinity of", etc., and such terms may be used interchangeably as appearing in the specification and claims. It should be appreciated that the term "proximate" is synonymous with terms such as "nearby", "close", "adjacent", "neighboring", "immediate", "adjoining", etc., and such terms may be used interchangeably as appearing in the specification and claims. Although any methods, devices or materials similar or equivalent to those described herein can be used in the practice or testing of the invention, the preferred methods, devices, and materials are now described.

All Software Modem

A method to provide flexibility on the configuration and operation of the modulator, demodulator, and modem, where purpose-built (legacy) devices are not traditionally capable of exposing a level of control and flexibly for a user or an autonomous program for optimizing performance. Providing user or programmatic control of algorithms is traditionally not possible for purpose-built modems. Parameters such as the number of decoder iterations that are performed on Forward Error Correction (FEC), Interference Mitigation algorithm, or dynamic adjustment loop bandwidth to combat phase noise can be adjusted autonomously to optimize receiver performance. The all software modem, supported by a High-Performance Computing (HPC) architecture, removes the limitation due to the flexibility of programming resources and available performance. Unlike most purpose-built hardware, the HPC allows processing resources to dynamically be reallocated, so that as additional performance is desired, the resources may be increased and decreased as required.

The objective of this method is to provide flexibility on the configuration and operation of the modulator, demodulator, and modem to the user or an autonomous program for optimizing performance in an all software modem, supported by a High-Performance Computing (HPC) architecture. For an all software modem, supported by a High-Performance Computing (HPC) architecture, this limitation may be removed due to the flexibility of programming resources, data storage, and available performance. Unlike purpose-built hardware, the HPC allows data storage resources to dynamically be reallocated, so that as additional performance is desired, the number of processing attempts may be increased and decreased as required. For a modem, the ability to increase the number of iterations for an FEC algorithm may be utilized to decrease the probability of receiving packet errors.

The ability to configure the number of iterations of a FEC algorithm may be tuned based on a number of operational needs such as: the need to observe a lower bit error rate at the expense of processing time, but conversely, the user may desire to trade off a higher bit error rate to achieve lower processing time. This flexibility is typically only achieved in a highly flexibility processing, data storage, and software environment that is available in high performance computing.

In addition to the described techniques, another mechanism for recovering lost or damaged packets is to reprocess received data in another manner, such as if the channel equalizer utilizes Least-Mean Squares (LMS), if the data is not recoverable by the FEC, then the data block could be reprocessed using a different equalization algorithm and then reprocessed again in the FEC. This level of flexibility is not currently offered in any purpose-built hardware solutions.

Interference, whether intentional or unintended, is increasingly becoming a problem in electronic communications. There are various techniques for mitigating interference, each targeted for specific interferers and environments. A highly flexible computing platform enables not only the ability to bring to bear the appropriate Interference Mitigation solution depending on the interference profile, but it allows for the receiver to adapt dynamically in scenarios such as electronic warfare. For example, a barrage jammer requires a different mitigation technique than a chirp jammer. A High-Performance Computing platform can detect in real time the type of jamming environment and apply, in real time, the proper technique to mitigate the interference.

Some communications links require the use of very low symbol rate carriers for various reasons such as robustness or the need to employ Direct Sequence Spread Spectrum while constraining occupied bandwidth. These low symbol rate carriers are highly susceptible to phase noise that is present on all oscillators. One way to combat phase noise is to increase the demodulator carrier recovery loop (CRL) bandwidth. However, this could also degrade thermal noise performance, so it is desired to have the narrowest CRL. In purpose-built receivers, the CRL is optimized for thermal noise precluding operation at very low symbol rates. The flexibility afforded by a High-Performance Computing platform allows adjustment of the CRL to optimize bit error performance regardless of whether phase noise or thermal noise dominates the link. By monitoring decoded errors in a low symbol rate carrier, the CRL bandwidth can be adjusted to obtain the best bit error rate performance.

Some of the previously described techniques, as well as other post-processing analysis techniques, require full fidelity storage of the received digitally sampled I/Q waveform for subsequent processing and/or reprocessing. Storing the full fidelity of the digitally sampled I/Q waveform requires extremely high capacity memory and extremely high memory bandwidth due to the high data rate. As such, storing the digitally sampled I/Q waveform is traditionally not possible in purpose-built receivers and modems. Storage of a digitally sampled I/Q waveform in all software modem supported by an HPC architecture is readily achievable due to the high capacity memory and extremely high memory bandwidth that is available within an HPC. Digitally sampled I/Q waveform data can be saved to the memory and retrieved for reprocessing in real-time operation or be retrieved and post processed at a later time. Other previously described techniques require storage of other types of data including decoder soft decisions, down sampled I/Q waveforms, and/or bit level data. Traditionally this data has not been stored in purpose-built modems, due to limited re-processing and post processing capabilities. This data can be saved to memory in an all software modem supported by an HPC architecture where access to memory is readily available.

The invention herein is directed as a system and method supporting the configuration of parameters in a manner that results in flexibility not traditionally exposed to the user. For this disclosure, the techniques described may be applied to both a modulator, demodulator or a combination of a modulator/demodulator also known as a modem. However, as will be clear to one skilled in the art, the techniques described are focused, but not limited to, the demodulation for optimization. In the prior art, the described method works, since all algorithms are traditionally hardcoded into the configuration. For the demodulator/decoder, the UQ samples may be equalized using the LMS algorithm to produce the soft decisions (of the decision logic) from the soft decision FEC decoder. For the FEC, the number of iterations that are allocated before a final coding block is deemed as error-free, or a flag is set indicating the block contains errors, is fixed. In the prior art, the ability to re-process a block of data through the demodulator/decoder, once corrupted, is not traditionally done. The described method in this disclosure describes alternatives for reprocessing in different manners to attempt to demodulate and decode user data in an error-free manner. The described method is supported by a High-Performance Computing (HPC) environment and provides a novel approach to utilize the described invention to provide extremely high-data rate, where the network data flows operate at extremely high data rates resulting in nearly "line rate" operation over all links (transmission paths) to ensure reliable transmission of data in real-time. Using the HPC to provide the additional compute power necessary for the introduction of the decoding/demodulation of the UQ data and FEC provides an additional step to ensure the data integrity can be accommodated to ensure that at the destination end, data can be received, re-sequenced, corrected (recreated) without the need to have data retransmitted as is required in the prior art. Using the advanced processing technology, these techniques may be accomplished in near real-time using a high-level coding language such as OpenCL or C (a high-level language) to implement the decoding and FEC functionality as a x86 based software application running on a High-Performance Computing platform. The system and method described leverages the ability to process and reprocess the demodulation/decoding of UQ data and FEC using the heterogeneous compute environments. The method defines the ability for a user to manually, or an automated program, to optimize the performance of these algorithms in a manner that provides control not typically available on purpose-built solutions in real-time.

A heterogeneous architecture is comprised of at least one or more processor cores to optimize performance and energy efficiency by appropriating computations matched to the type of processor available. These cores can be, but are not limited to, a general-purpose CPU, Graphics Processing Units (GPU), or Field Programmable Gate Arrays (FPGA's).

It is the objective of this invention to provide a method for providing extremely reliable communications for real-time data, at extremely high data rates, using a combination of techniques that are traditionally not configurable and used in combination either serially or in parallel, while utilizing HPC type applications leveraging at least one hardware-based accelerator.

These objectives are accomplished by the various aspects of the invention that uses multiple factors to create a high-speed, reliable, and redundant transmission path while minimizing the dependency on retransmission of data on any transmission path. The present disclosure covers the steps required to accomplish the use of the methods described while using a High-Performance Computing (HPC) application.

This disclosure, its aspects and implementations, are not limited to the specific processing techniques, components, word/bit widths, or methods disclosed herein. Many additional components and processes known in the art consistent with the modification, manipulation and encryption and decryption of a file or files by a computer program are in use with particular implementations from this disclosure. Accordingly, for example, although particular implementations are disclosed, such implementations and implementing components may comprise any components, models, versions, quantities, and/or the like as is known in the art for such systems and implementing components, consistent with the intended operation.

Particular implementations of a method and approach within an HPC architecture of how to provide reliable, high-performance and path diverse transmission is described. However, as will be clear to those of ordinary skill in the art from this disclosure, the principles and aspects disclosed herein may readily be applied to a multitude of transmission paths regardless of the latency and reliability of a given transmission path applications without undue experimentation.

FIG. 1 depicts the prior art of a particular implementation of a communications transmission system wherein the forward path (transmitting station to a receiving station) where transmit station contains a transmit modulator and the receiver contains a receiving demodulator. The modem in the prior art is a purpose-built device, typically a dedicated "box" that transmits and is called a modulator. The modulator outputs either an intermediate frequency (IF) that may be unconverted to a radio frequency (RF) or directly output from the modulator as a radio frequency, possibly power amplified, and transmitted through free space, to an airborne, or satellite repeating relay. At the receiving station, the receive modem in the prior art is a purpose-built device, typically a dedicated "box" that receives and is called a demodulator. The demodulator receives (inputs) either an intermediate frequency (IF) that may be down converted from a radio frequency (RF) or directly input from the receive antenna as a radio frequency signal.

Figure 2:
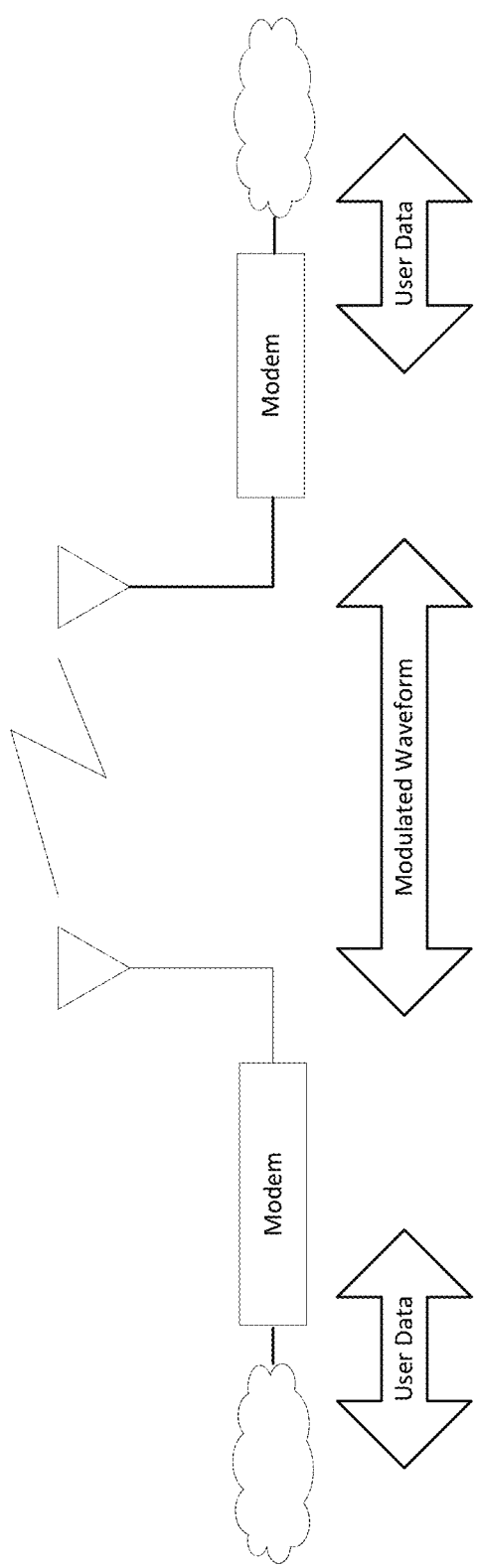
FIG. 2 depicts a network consisting of a combined modulator and demodulator (modem) for a duplex (two-way) communication network.

FIG. 2 depicts an alternate embodiment, of the prior art where the modulator and demodulator are combined in a single device known as a modulator/demodulator also known as a modem. As a modem, each station may contain a modem that provides both transmit and receive capability, modulation and demodulation, respectively. The modem at each station may provide a full-duplex communications path.

Figure 3:
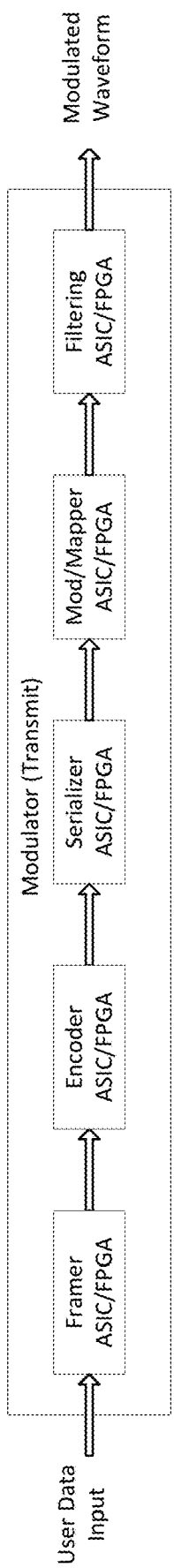
FIG. 3 depicts the prior art of a particular implementation of using a purpose-built modulator.

FIG. 3 depicts the prior art with each component of a purpose-built modem using specialized hardware that comprises both the transmit path. The individual processing modules as specialized hardware devices and processing modules written in a low-level specialized hardware description language (HDL) is shown.

Figure 4:
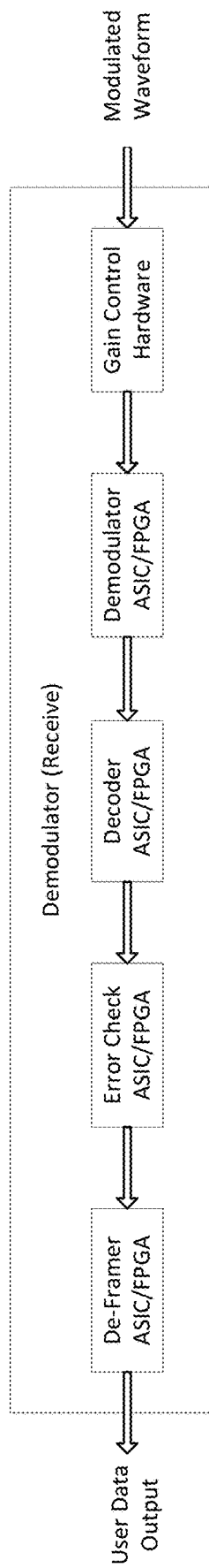
FIG. 4 depicts the prior art of a particular implementation of using a purpose-built demodulator.

FIG. 4 depicts the prior art with each component of a purpose-built modem using specialized hardware that comprises both the receive path. The individual processing modules as specialized hardware devices and processing modules written in a low-level specialized hardware description language (HDL) is shown.

Figure 5:
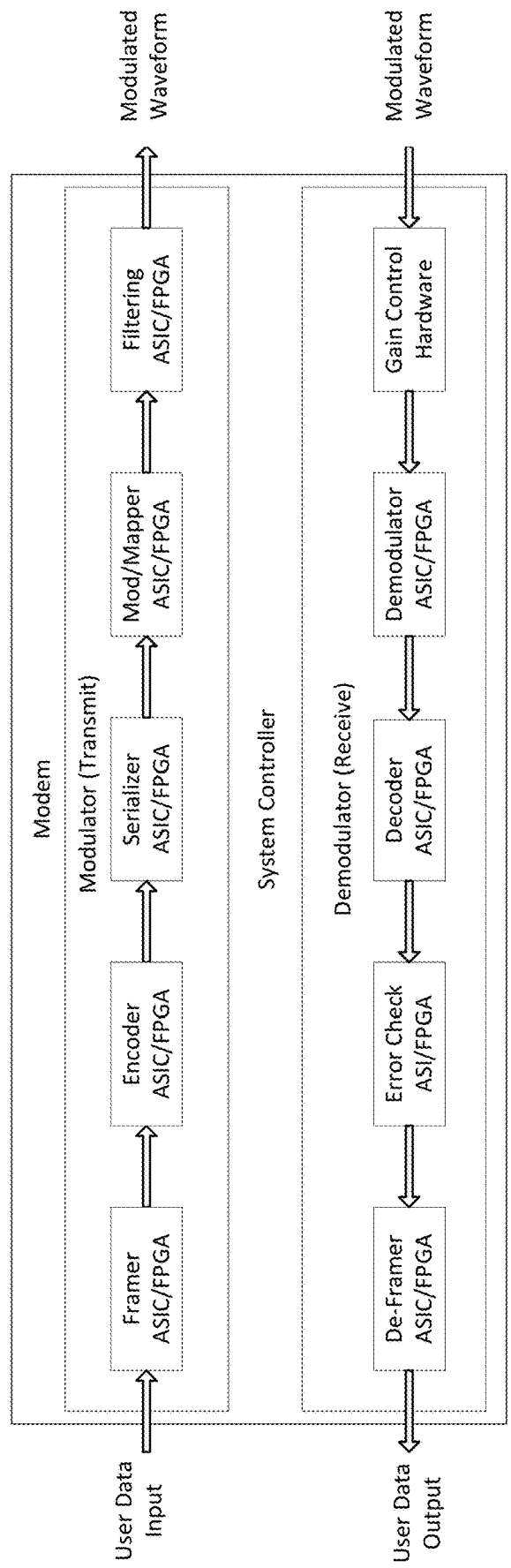
FIG. 5 depicts the prior art of a particular implementation of using a purpose-built modulator/demodulator modem.

FIG. 5 depicts the prior art with each component of a purpose-built modem using specialized hardware that comprises both the transmit or modulation path, and the receive or demodulation path. The individual processing modules as specialized hardware devices and processing modules written in a low-level specialized hardware description language (HDL) is shown.

Figure 6:
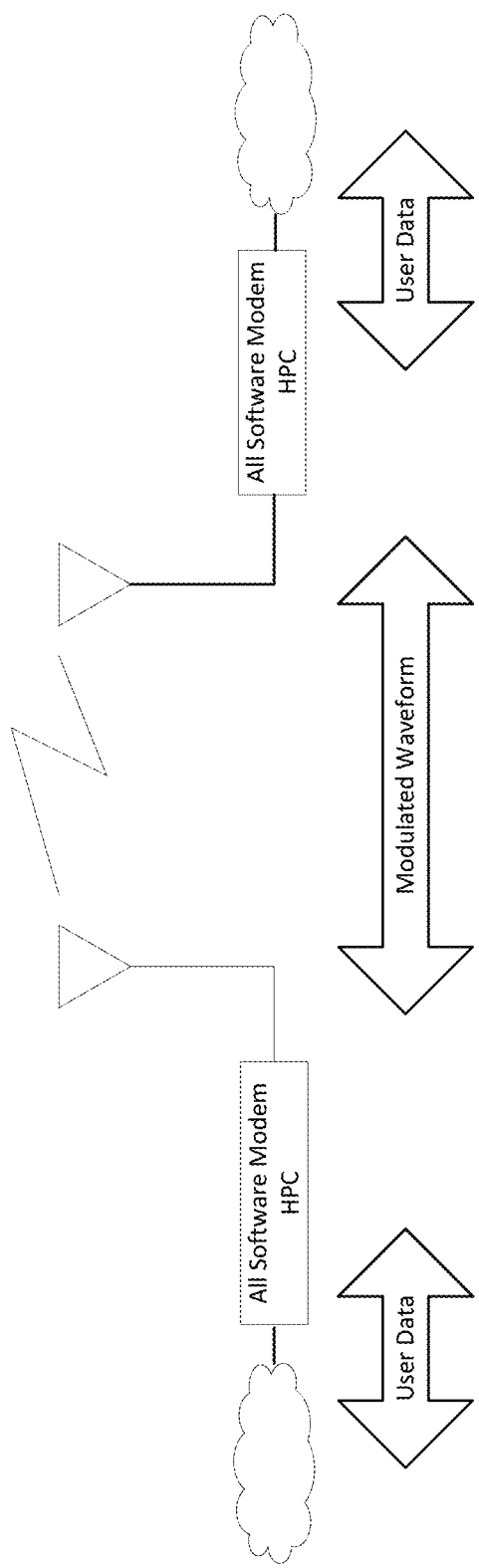
FIG. 6 depicts the prior art of particular implementation of using an all software modem hosted by an HPC.

FIG. 6 depicts an alternate embodiment, of the prior art where the modulator and demodulator are combined in a single device as an all software modem on an HPC known as a modulator/demodulator also known as a modem. As a modem, each station may contain a modem that provides both transmit and receive capability, modulation and demodulation, respectively. The modem at each station may provide a full-duplex communications path.

Figure 7:
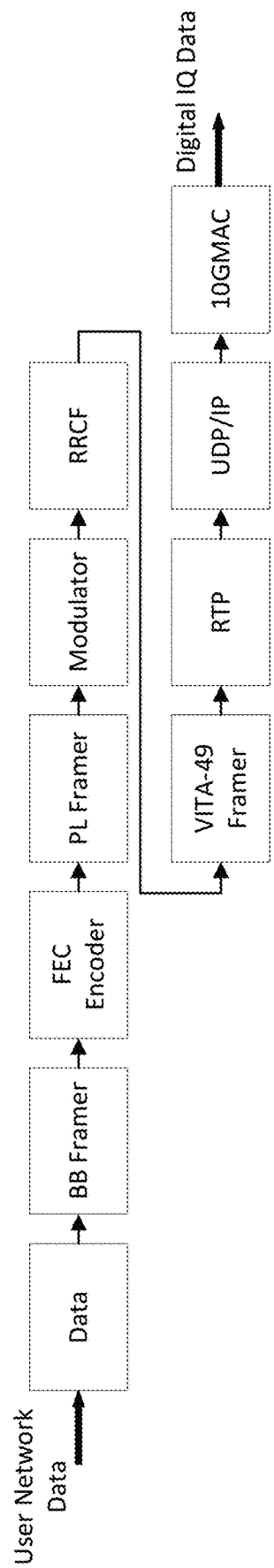
FIG. 7 depicts the modules required to perform modulation.

FIG. 7 depicts the modulator stages of a modulator from the user network data input, Base-Band (BB) Framer, FEC encoder, Physical Layer (PL) Framer, modulator, Root-Raise Cosine Filter (RRCF) for pulse shaping, the Digital IF transport formatting to the Ethernet transmitter. These functions are all present in both the purpose-built configuration as well as the all software version of the modulator running in a HPC.

Figure 8:
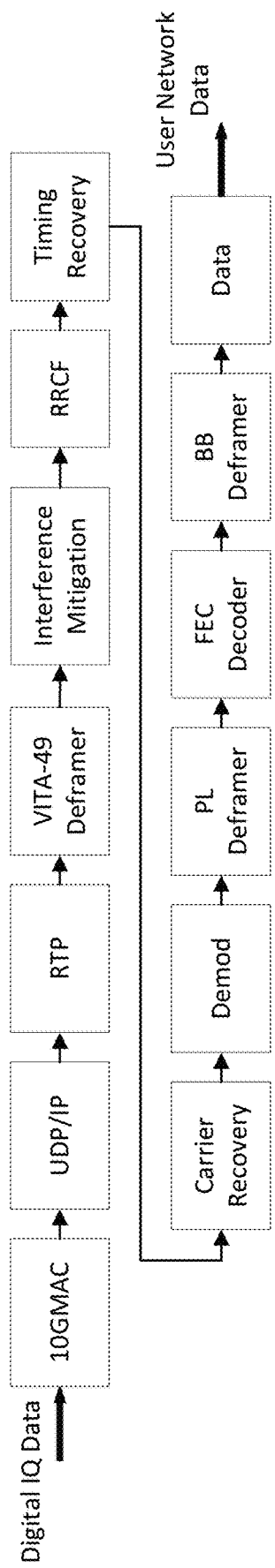
FIG. 8 depicts the modules required to perform demodulation.

FIG. 8 depicts the demodulator stages of a demodulator from the Ethernet receiver, Digital IF transport receiver, Interference Mitigation (IM), Root-Raised Cosine Filter (RRCF) and Equalizer, Timing Recovery, Carrier Recovery, Demodulator, PL Deframer, FEC Decoder, BB Deframer, and user network data output. These functions are all present in both the purpose-built configuration as well as the all software version of the modulator running in a HPC.

Figure 9:
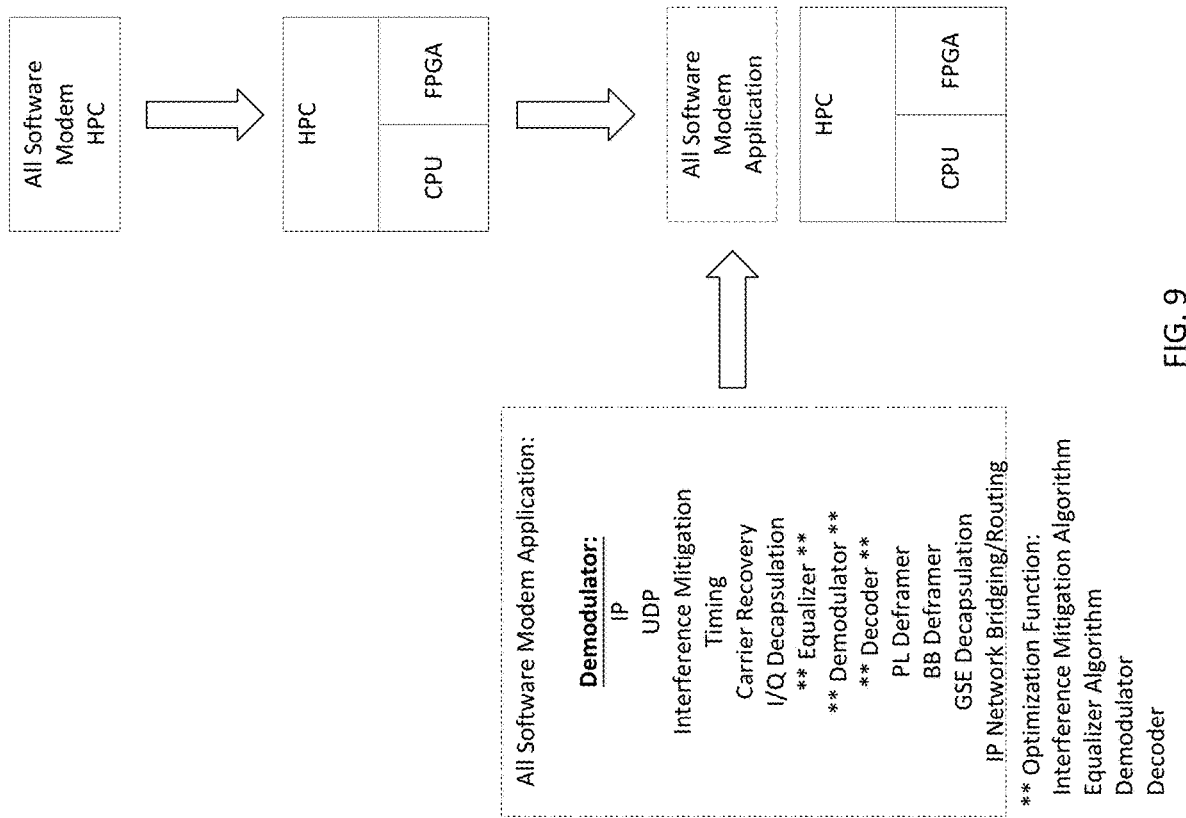
FIG. 9 depicts an embodiment of the described invention with a configurable demodulator features for optimization.

FIG. 9 depicts a preferred implementation where the demodulator's configuration options are illustrated. The configuration of the IM, equalizer, timing, carrier recovery, demodulator, and decoder are all parameters that may be adjusted in a manner allowing each of these functions to be optimized or completely changed to support alternative operations to improve performance. Since each of the functions are supported as all software functions within the HPC, altering, replacing, serializing, or parallelizing the function is possible. Data at the various stages indicated in the demodulator can be stored and retrieved with full fidelity. In the prior art, each function is typically performed by a device or Register Transfer Level (RTL) code written in a Hardware Description Language (HDL) such as Very High-Speed Integrated Circuit Hardware Description Language (VHDL), and lacks the ability to store data, so allowing for dynamic modifications becomes difficult.

Unique to the HPC architecture, is the ability to run additional applications that can adaptively alter the FEC parameters as user needs change. While the ability to increase the number of LDPC iterations and modify the equalizer may be done in a manual fashion, the novelty of the invention is a level of desired performance, at the expense of processing time and complexity, may be configured by the user (dynamically) and the ability to perform processing of an incoming signal, and reprocess, the signal until the desired results are achieved in an autonomous fashion via a computer program or set of rules executed by the HPC and a high-level language while operating in a heterogeneous fashion may be performed using the described invention.

Figure 10:
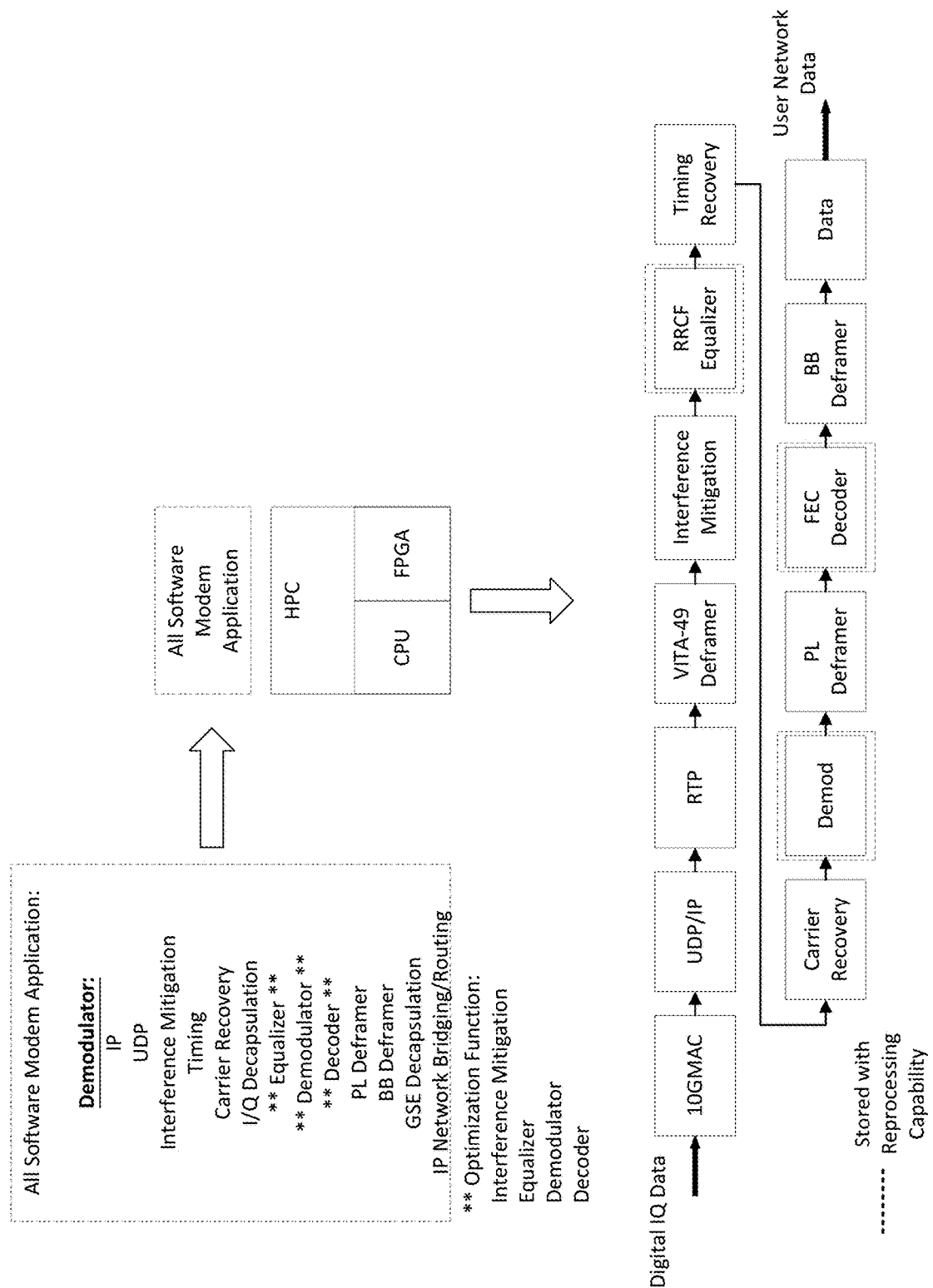
FIG. 10 depicts an embodiment of the described invention with a configurable demodulator features for optimization as a detailed receiving chain.

FIG. 10 depicts the preferred embodiment where the IM, RRCF and Equalizer, Demodulator, and Decoder are shown as an all software processes where the incoming data in the form of frames and packets are processed and stored. Even after the incoming data is stored, all data will be held in queue for a period of time to allow the downstream processes to operate on the incoming data. In the event the downstream data cannot be decoded, the novelty of the invention allows for the method to go back to previous stages or time and "reprocess" the data in a different manner. For the RRCF and Equalizer, in the event a block of data cannot be processed, a signal may be sent back to the RRCF and Equalizer to attempt to reprocess a block of data that failed the decoding of a FEC block using a different equalization algorithm such as Recursive Least Squares (RLS) or Zero Forcing (ZF). Additionally, if the FEC decoding failed, the FEC decoding could be instructed to change operation and instead of stopping at "N iterations," a command may be given to increase the iteration count to "N+Y iterations," where Y is larger or much larger than N to further attempt to decode a damaged frame of data. Each of the blocks shown with reprocessing capability may be brought to bear for reprocessing to improve the ability to decode incoming receive data.

Figure 11:
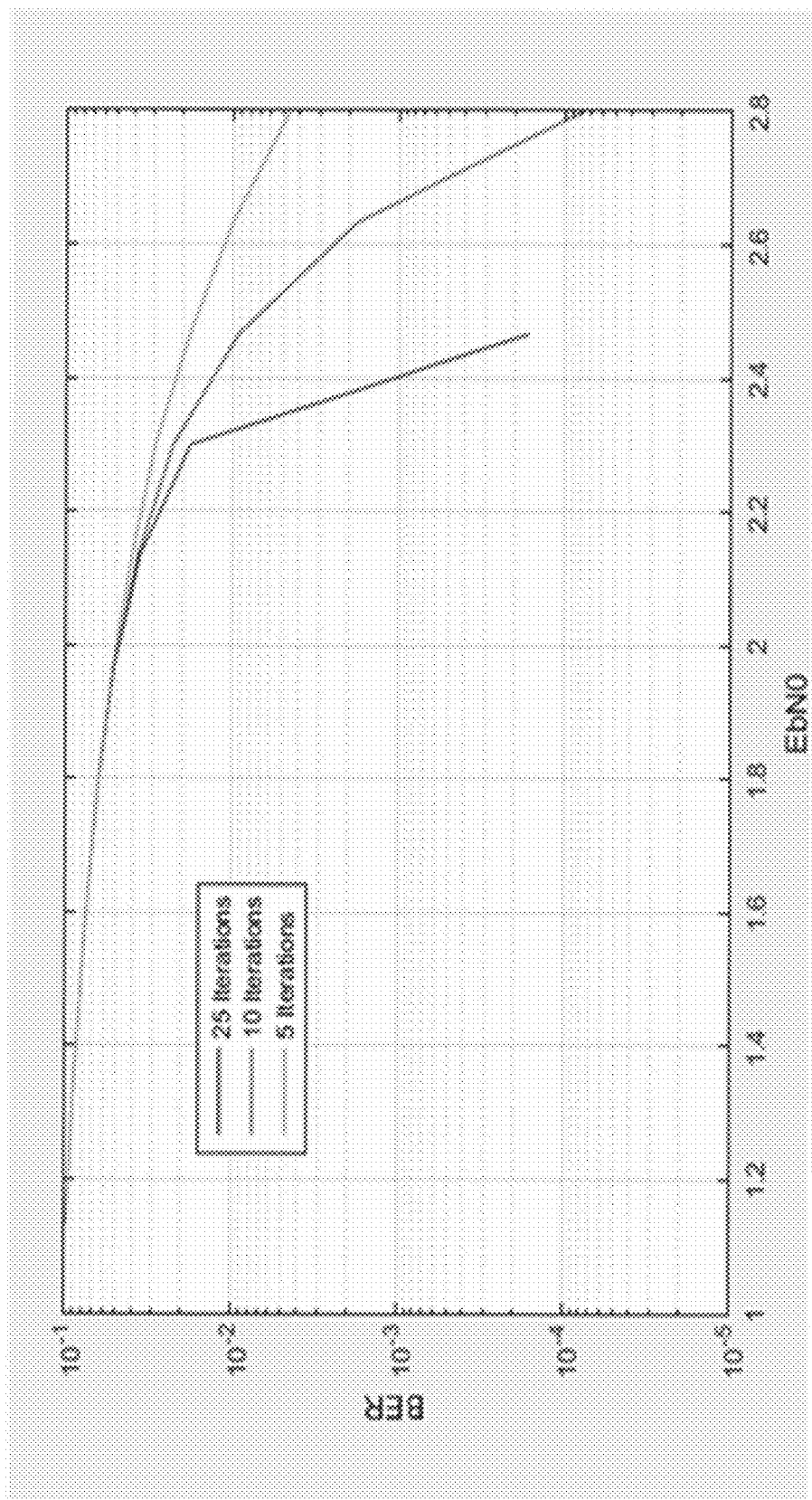
FIG. 11 depicts prior art performance for the FEC decoder with an implementation of the disclosure with up to 25 iterations.

FIG. 11 depicts an example of the prior art of a decoder that would attempt up to 25 times to decode an incoming FEC frame. If the decoder converged to a good solution in 5, 10, or 25 iterations (or any number of iterations, the Bit Energy over the Noise Density (Eb/No) would provide the resulting Bit Error Rate (BER) performance as shown on the graph. However, the resulting performance would be limited by a maximum number of iterations and then the FEC decoder would stop (give up) and the BER would be limited. In the prior art, the number of iterations must be bound, since there is a finite limit to the number of times an FEC decoder can run, but this is fixed due to the limited flexibility in the design. For the purpose-built modem, these parameters are traditionally limited.

Figure 12:
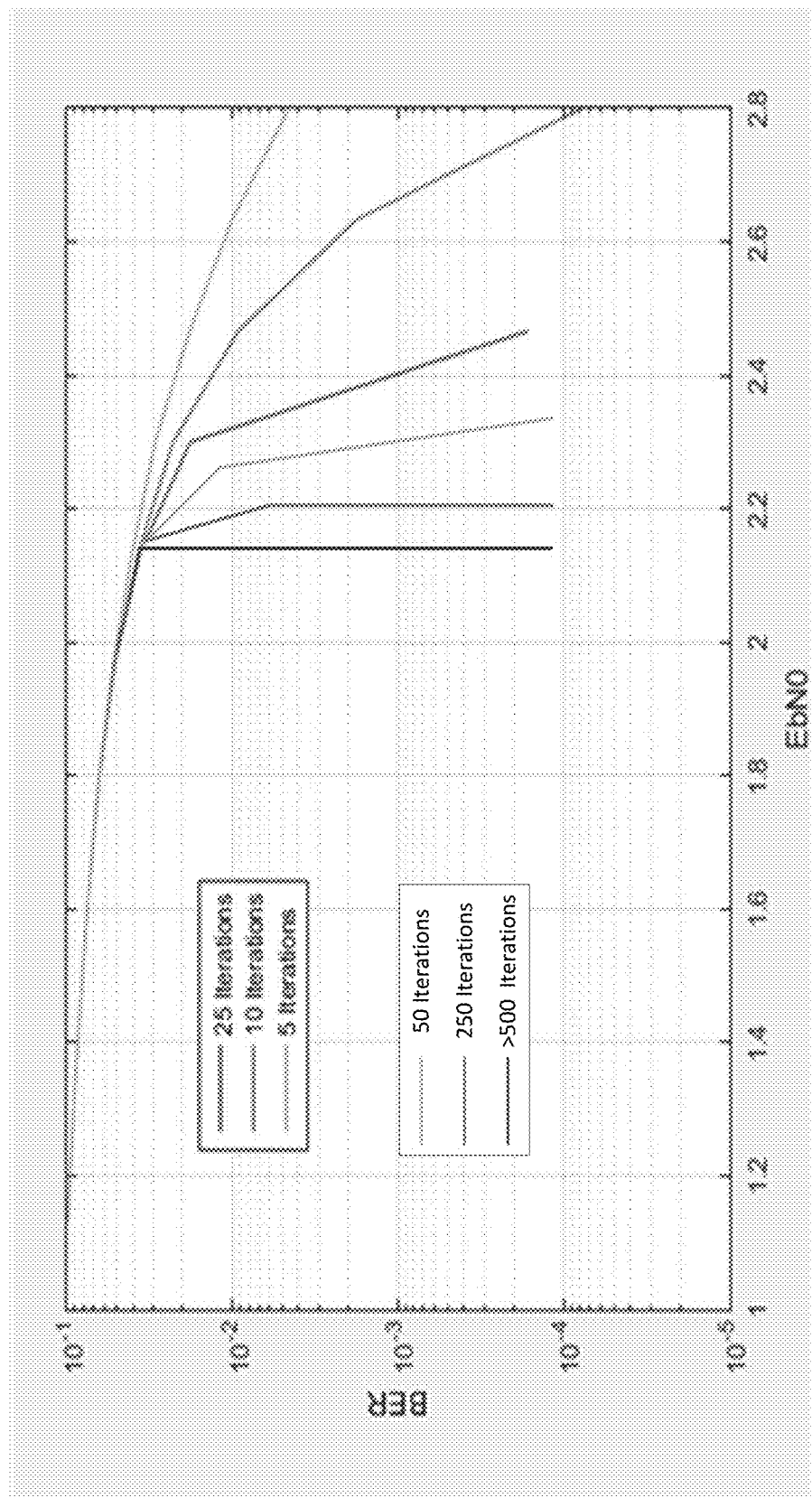
FIG. 12 depicts an embodiment of the performance improvement for the FEC decoder with an implementation of the disclosure with up to 500 iterations.

FIG. 12 depicts an example of the preferred embodiment where the decoder can be configured to attempt to decode an incoming FEC frame as much as desired. The configuration of the FEC decoder can be dynamically adjusted to meet the mode of operation (mission requirements) so the number of FEC decoder iterations may be increased so the resulting Bit Error Rate (BER) performance could reduce for the same level of Bit Energy over the Noise Density (Eb/No) as shown on the graph. As is demonstrated, the higher the number of iterations, the steeper the BER curves become, but at the expense of processing time. The number of iterations is less bound, since there is not a finite limit to the number of times an FEC decoder can run, and this provides flexibility in the design. For the all software modem, these parameters are not limited.

FIG. 13 depicts the user interface of the preferred embodiment where the FEC Decoder's number of LDPC iterations may be adjusted and Equalizer Type may be configured. These are both shown as non-limiting examples of the flexibility of the described invention.

The following are particular implementations with the all software modem on an HPC application, and the use of these methods are provided as non-limiting examples.

1. A user desires to receive a communications carrier configured as DVB-S2. The information being sent is extremely critical information and is not time sensitive. Receipt of the information is critical to the user, so the number of LDPC Decoder iterations is increased from 25, which provides minimal processing delay to 500. At 500 iterations, the processing time is longer, but the result is the message may be received at a much lower threshold, e.g. Eb/No, resulting in the message being received. Using the method in this example, the processing time is increased by many times, but the critical message may be delivered, so even with low carrier power than normal, the message may be decoded and delivered.

2. A user desires to receive a communications carrier configured as DVB-S2. The information being sent is time critical information and cannot be delayed. Receipt of the information is critical to the user, but minimizing delay of the information is required. The number of LDPC Decoder iterations is decreased to a minimum number such as five (5), which provides minimal processing delay. At five (5) iterations, the processing time is short, but the result is the message must be received at a high threshold, e.g. Eb/No, resulting in the message being received. Using the method in this example, the processing time is decreased by many times, but the critical message may be delivered only if the carrier power is higher than normal, to ensure minimal bit errors.

3. A user desires to receive a communications carrier configured as DVB-S2. The information being sent is extremely critical information and is not time sensitive. Receipt of the information is critical to the user, so the user may allow the data to be reprocessed. If the LDPC decoder cannot provide reliable data (error free), the user may enable the ability to utilize multiple equalizers. The preferred method would store all incoming digital I/Q packets and if notified by the LDPC decoder the data could not be decoded, the stored packets cold be reprocessed (re-received) with a different equalizer and passed back into the LDPC decoder. This method could be repeated for multiple equalizer configurations until the LDPC decode can decode the incoming data or reaches a threshold of iterations or time limit and the operation would cease.

4. A user desires to receive a communications carrier configured as DVB-S2. The information being sent is extremely critical information and is not time sensitive. Receipt of the information is critical to the user, so the user may allow the data to be reprocessed. If the LDPC decoder cannot provide reliable data (error free), the user may enable the ability to alter the incoming Digital UQ stream by running an inference mitigation program on the incoming data. The alternative method would store all incoming digital UQ packets and if notified by the LDPC decoder the data could not be decoded, the stored packets could be reprocessed (re-received) with data being reprocessed with the interference mitigation program and passed back into the LDPC decoder. This method could be repeated for multiple interference mitigation configurations until the LDPC decode can decode the incoming data or reaches a threshold of iterations or time limit and the operation would cease.

5. A user desires to receive a communications carrier configured as DVB-S2. The information being sent is extremely critical information and is not time sensitive. Receipt of the information is critical to the user, so the user may allow the data to be reprocessed. If the LDPC decoder cannot provide reliable data (error free), the user may enable the ability to alter the incoming Digital UQ stream by running both a different equalizer algorithm and inference mitigation algorithm on the incoming data. The alternative method would store all incoming digital UQ packets and if notified by the LDPC decoder the data could not be decoded, the stored packets cold be reprocessed (re-received) with data being reprocessed with the interference mitigation program and passed back through the equalizer and into the LDPC decoder. This method could be repeated for multiple equalizer configurations until the LDPC decode can decode the incoming data or reaches a threshold of iterations or time limit and the operation would cease.

6. A user desires to receive a communications carrier configured as DVB-S2. The information being sent is extremely critical information and is not time sensitive. Receipt of the information is critical to the user, so the user may allow the data to be reprocessed. If the LDPC decoder cannot provide reliable data (error free), the user may enable the ability to utilize multiple equalizers. The preferred method would store all incoming digital UQ packets and if notified by the LDPC decoder the data could not be decoded, the stored packets could be reprocessed (re-received) with a multiple (simultaneous) equalizers in parallel and a voting performed to see if more than one (1) equalizer configuration results in the same data and passed back into the LDPC decoder. This method could be repeated for multiple equalizer configurations until the LDPC decode can decode the incoming data or reaches a threshold of iterations or time limit and the operation would cease.

7. A user desires to receive a communications carrier configured as DVB-S2. The information being sent is extremely critical information and is not time sensitive. Receipt of the information is critical to the user, so the user may allow the data to be reprocessed. If the LDPC decoder cannot provide reliable data (error free), the user may enable the ability to utilize multiple equalizers. The preferred method would store all incoming digital UQ packets and if notified by the LDPC decoder the data could not be decoded, the stored packets cold be reprocessed (re-received) with a multiple (simultaneous) equalizers in serial and a voting performed to see if more than one (1) equalizer configuration results in the same data and passed back into the LDPC decoder. This method could be repeated for multiple equalizer configurations until the LDPC decode can decode the incoming data or reaches a threshold of iterations or time limit and the operation would cease.

8. A user desires to receive a communications carrier configured as very low symbol rate BPSK. The information being sent is extremely critical information and is not time sensitive. Receipt of the information is critical to the user, so the user may allow the data to be reprocessed. Low symbol rate carriers are highly susceptible to system phase noise. If the FEC decoder cannot provide reliable data (error free), the user may enable the configuration of a wider carrier recovery loop bandwidth to track the phase noise in the link. The received IQ data would be stored in a queue sufficiently sized to allow multiple carrier recovery loop bandwidth of increasing size to be tried that minimizes the decoded errors.

9. A user desires to receive a communications carrier configured as very low symbol rate BPSK. The information being sent is extremely critical information and is time sensitive. Receipt of the information is critical to the user so any delays through processing queues must be avoided. Low symbol rate carriers are highly susceptible to system phase noise. If the FEC decoder cannot provide reliable data (error free), the user may enable the configuration of carrier recovery bandwidth adaptation to incrementally change the bandwidth to minimize the decoded errors. The adaptation is done in a streaming manner, without employing any processing queues where the bandwidth is incrementally changed and decoded error metrics are continuously monitored until it is minimized. Once the errors are minimized, the adaptation can be disabled.

All references cited in this specification are herein incorporated by reference as though each reference was specifically and individually indicated to be incorporated by reference. The citation of any reference is for its disclosure prior to the filing date and should not be construed as an admission that the present disclosure is not entitled to antedate such reference by virtue of prior invention.

It will be understood that each of the elements described above, or two or more together may also find a useful application in other types of methods differing from the type described above. Without further analysis, the foregoing will so fully reveal the gist of the present disclosure that others can, by applying current knowledge, readily adapt it for various applications without omitting features that, from the standpoint of prior art, fairly constitute essential characteristics of the generic or specific aspects of this disclosure set forth in the appended claims. The foregoing embodiments are presented by way of example only; the scope of the present disclosure is to be limited only by the following claims.

We claim:

1. A method for optimization of an all software modem using flexible configuration parameters for high-performance computing (HPC) platform comprising:
    receiving a digital IQ data at the all software modem, wherein the all software modem comprises a demodulator, and wherein the demodulator is configured to adjust demodulator parameters;
    storing and queuing the digital IQ data for downstream processes for each demodulator stage;
    adjusting the demodulator parameters of a demodulator stage in response to decoding of data fails; and
    re-attempting the demodulator stage with the adjusted demodulator parameters.

2. The method of claim 1, wherein the all software modem is an application running on a HPC platform implemented via a high-level coding language.

3. The method of claim 1, wherein the HPC platform comprising at least one or more processor cores and wherein the cores comprise at least one of a general purpose central processing unit, a graphic processing unit, a field programmable gate arrays, or a combination thereof.

4. The method of claim 1, wherein the demodulator comprises a digital IF transport receiver, an Interference Mitigation (IM), a Root-Raised Cosine Filter (RRCF), an equalizer, a timing recovery, a carrier recovery, a signal demodulator, a PL Deframer, a FEC Decoder, a BB Deframer.

5. The method of claim 4, wherein the demodulator is configured to adjust parameters of the IM, the equalizer, the timing recovery, the carrier recovery, the demodulator, and the decoder.

6. The method of claim 1, the digital IQ data at a demodulator stage is stored and retrieved with full fidelity.

7. The method of claim 4, wherein the method further comprises altering FEC parameters and increasing a number of Low-Density Parity Check (LDPC) iterations.

8. The method of claim 1, wherein the data is reprocessed with the adjusted parameters at a current demodulator stage or a previous demodulator stage in response to the decoding of the data fails.

9. The method of claim 4, wherein a signal is sent back to the RRCF and the equalizer to attempt to reprocess a block of data that failed a decoding of a FEC block using a recursive least squares or a zero forcing algorithm in response to the block of data is not processed.

10. The method of claim 4, wherein a number of decoding attempt increases at the FEC block in response to the FEC decoding fails.

11. A method for sending data via all software modem using flexible configuration parameters for high-performance computing (HPC) platform, the method comprising:
    sending a first user network data from a source;
    receiving the first user network data at a first modem, wherein the first user network data is modulated to a digital IQ data;
    sending the digital IQ data to a destination via a network;
    receiving the digital IQ data at a second modem, wherein the second modem is configured to adjust parameters of demodulator stages;
    demodulating the digital IQ data to a second user network data; and
    receiving the second user network data at the destination, wherein the all software modem comprising a digital IF transport receiver, an Interference Mitigation (IM), a Root-Raised Cosine Filter (RRCF), an equalizer, a timing recovery, a carrier recovery, a demodulator, a PL Deframer, a FEC Decoder, a BB Deframer, and wherein a signal is sent back to the RRCF and the equalizer to attempt to reprocess a block of data that failed a decoding of a FEC block using a recursive least squares or a zero forcing algorithm in response to the block of data is not processed.

12. The method of claim 11, wherein the all software modem is an application running on a high-performance computing platform implemented via a high-level coding language.

13. The method of claim 11, wherein the HPC platform comprising at least one or more processor cores and wherein the cores comprise at least one of a general purpose central processing unit, a graphic processing unit, or a field programmable gate arrays.

14. The method of claim 11, wherein the second modem is configured to adjust parameters of the IM, the equalizer, the timing recovery, the carrier recovery, the demodulator, and the decoder.

15. The method of claim 11, wherein the digital IQ data at a demodulator stage is stored and retrieved with full fidelity.

16. The method of claim 11, wherein the method further comprises altering a Forward Error Correction (FEC) parameters and increasing a number of Low-Density Parity Check (LDPC) iterations.

17. The method of claim 15, wherein the stored digital IQ data is held in a queue to allow downstream processes.

* * * * *